United States Patent
Hori et al.

(10) Patent No.: US 7,556,970 B2
(45) Date of Patent: Jul. 7, 2009

(54) METHOD OF REPAIRING DAMAGED FILM HAVING LOW DIELECTRIC CONSTANT, SEMICONDUCTOR DEVICE FABRICATING SYSTEM AND STORAGE MEDIUM

(75) Inventors: Masaru Hori, Nagoya (JP); Kazuhiro Kubota, Nirasaki (JP)

(73) Assignees: Tokyo Electron Limited, Tokyo (JP); National University Corporation, Nagoya University, Aichi-ken (JP)

( * ) Notice: Subject to any disclaimer, the term of this patent is extended or adjusted under 35 U.S.C. 154(b) by 226 days.

(21) Appl. No.: 11/727,392

(22) Filed: Mar. 26, 2007

(65) Prior Publication Data

US 2007/0232076 A1      Oct. 4, 2007

Related U.S. Application Data

(60) Provisional application No. 60/792,946, filed on Apr. 19, 2006.

(30) Foreign Application Priority Data

Mar. 27, 2006   (JP)   .............................. 2006-085973

(51) Int. Cl.
   *H01L 21/00* (2006.01)

(52) U.S. Cl. ............................ 438/4; 438/637; 438/700; 438/710; 438/778; 257/E21.191; 257/E21.211; 257/E21.238

(58) Field of Classification Search ................... 438/12, 438/42, 513, 707, 709, 726; 257/E21.191
See application file for complete search history.

(56) References Cited

U.S. PATENT DOCUMENTS 7,329,601 B2 *   2/2008   Miyajima ................... 438/637

FOREIGN PATENT DOCUMENTS

JP        2005-340288        12/2005

\* cited by examiner

*Primary Examiner*—Walter L Lindsay, Jr.
*Assistant Examiner*—Cheung Lee
(74) *Attorney, Agent, or Firm*—Smith, Gambrell & Russell, LLP

(57) ABSTRACT

A damaged layer repairing method repairs a damaged layer formed in a surface of a SiOCH film having a low dielectric constant film, containing silicon, carbon, oxygen and hydrogen and formed on a substrate through the elimination of carbon atoms by the decarbonizing effect of plasmas used in an etching process and an ashing process. $CH_3$ radicals are produced through the thermal decomposition of $C_8H_{18}O_2$ gas represented by a structural formula: $(CH_3)_3COOH(CH_3)_3$. $CH_3$ radicals are brought into contact with the damaged layer in the SiOCH film and are made to bond to the damaged layer to repair the damaged layer.

13 Claims, 14 Drawing Sheets

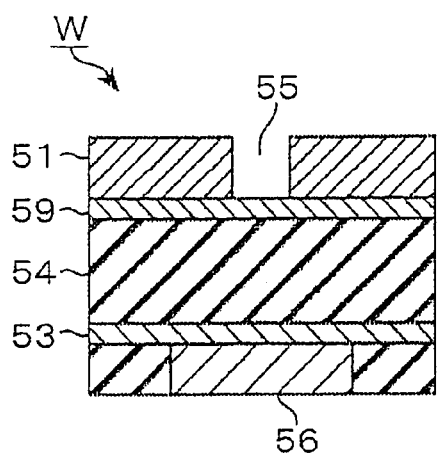
FIG. 4A
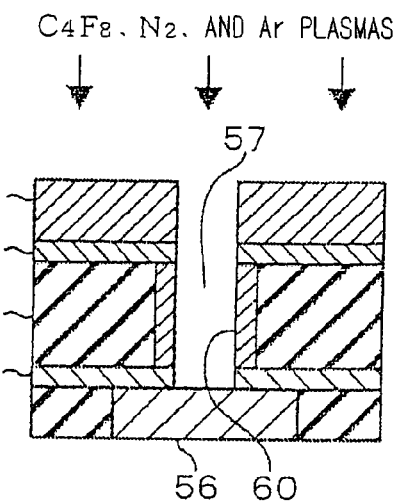
ETCHING PROCESS
C₄F₈, N₂, AND Ar PLASMAS
FIG. 4B
ASHING PROCESS
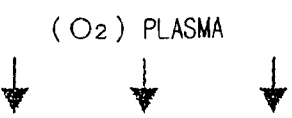
(O₂) PLASMA
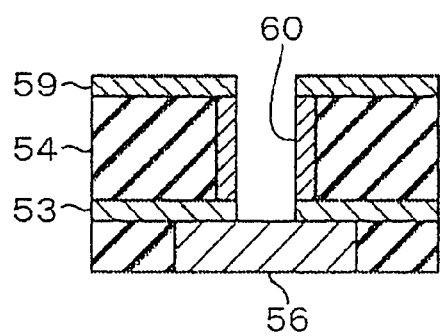
FIG. 4C
REPAIRING PROCESS
CH₃ RADICALS
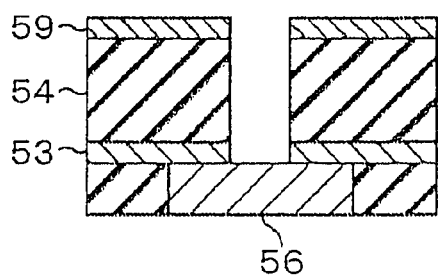
FIG. 4D

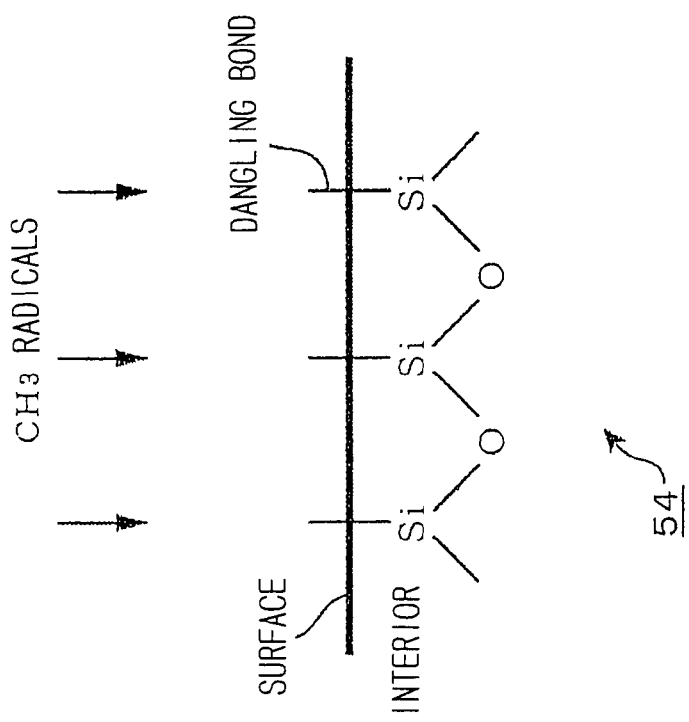

L = L2 − L1

C8H18O2 SUPPLYING AND EXHAUSTING SIDE

METHOD OF REPAIRING DAMAGED FILM HAVING LOW DIELECTRIC CONSTANT, SEMICONDUCTOR DEVICE FABRICATING SYSTEM AND STORAGE MEDIUM

CROSS REFERENCE TO RELATED APPLICATIONS

This application is based upon and claims the benefit of priority from the prior Japanese Patent Application No. 2006-85973 filed on Mar. 27, 2006 and U.S. Patent Preliminary Application No. 60/792,946 filed on Apr. 19, 2006, the entire contents of which are incorporate herein by reference.

BACKGROUND OF THE INVENTION

1. Technical Field

The present invention relates to a technique using a plasma for repairing a decarbonized, damaged layer in a film having a low dielectric constant (hereinafter referred to as "low-dielectric-constant film") and containing silicon, carbon, oxygen and hydrogen.

2. Description of the Related Art

There is a growing tendency for the scale of integration of semiconductor devices to increase every year. Resists and exposure techniques have been progressively improved to deal with the progressive miniaturization of patterns formed on a substrate, such as a semiconductor wafer (hereinafter, referred to simply as "wafer"), and the dimensions of apertures formed in resist masks have been remarkably decreased.

On the other hand, multiple-layer devices have been developed to achieve increasing the scale of integration. The parasitic capacitances of the semiconductor device need to be reduced to improve the circuit speed. Therefore, efforts have been made to develop materials having a low dielectric constant for forming insulating films, such as layer insulating films. An example of such a desirable insulating film is SiOCH film generally called a porous MSQ film having Si—C bonds (Methyl-hydrogen-silses-quioxane film).

The SiOCH film, in which copper lines or such are embedded, is etched with a $CF_4$ plasma produced by ionizing $CF_4$ gas through a resist mask and a hard mask, and the resist mask is removed by an ashing process using an oxygen plasma produced by ionizing oxygen gas. FIG. 14 is a typical view illustrating processing the SiOC film. Shown in FIG. 14 are a SiOCH film, a resist mask 101 and a hard mask 102.

When the SiOCH film 100 is subjected to a plasma-etching process or a plasma-ashing process, Si—C bonds in a surface layer exposed to a plasma in the SiOCH film formed on the side walls and the bottom wall of a recess are broken and C atoms are eliminated from the SiOCH film and Si atoms having dangling bonds remains in the surface layer. Si atoms having dangling bonds formed through elimination of C atoms from Si—C bonds are unstable. The unstable Si atoms and moisture contained in the atmosphere bond together to produce Si—OH bonds.

Thus the plasma etching process or the plasma ashing process damages the exposed surface layer of the SiOCH film and forms a damaged layer 103. Since the damaged layer 103 has a low carbon content and hence has a low dielectric constant. The width of lines forming a wiring pattern and the thickness of wiring layers and insulating films have been progressively reduced. Therefore, the significance of the influence of the surface layer relative to that of a wafer W has increased and even the reduction of the dielectric constant of the surface layer can be one of factors that cause the characteristics of a semiconductor device to differ from design characteristics.

A method of solving such a problem is disclosed in JP-A 2005-340288 (Paragraphs [0010] and [0028]). This previously proposed method modifies the damaged surface layer containing OH groups produced by dry etching by using a silazane compound having Si—Si bonds and Si—$CH_3$ bonds. This method is a surface modification method that replaces the hydrogen atoms of the OH groups with the silazane compound and does not restore the damage surface layer to its original state before the plasma etching process or the plasma ashing process. Therefore the dielectric constant of the SiOCH film is different from a design dielectric constant. Since the molecules of the silazane compound are large, molecules formed by replacing the hydrogen atoms of the OH groups with the silazane compound cause steric hindrance, molecules cannot penetrate deep into the film and hence the interior of the film cannot be modified.

SUMMARY OF THE INVENTION

The present invention has been made under such circumstances and it is therefore an object of the present invention to provide a method of repairing a damaged layer, from which carbon atoms have been eliminated by the decarbonizing effect of a process using a plasma, formed in a low-dielectric-constant film containing silicon, carbon, oxygen and hydrogen and formed as an insulating film on a surface of a substrate.

A damaged layer repairing method according to the present invention includes: a $CH_3$ radical producing process for producing $CH_3$ radicals by supplying energy to a $CH_3$ radical source gas; and a repairing process for repairing a damaged layer, from which carbon atoms have been eliminated, formed in a low-dielectric-constant film containing silicon, carbon, oxygen and hydrogen by supplying the $CH_3$ radicals with the low-dielectric-constant film and bonding the $CH_3$ radicals to the damaged layer.

The $CH_3$ radical producing process may produce $CH_3$ radicals through the thermal decomposition of the $CH_3$ radical source gas.

The damaged layer may be formed by a damaged layer formable process in which the low-dielectric-constant film is exposed to a plasma.

A damaged layer formable process in which the low-dielectric-constant film is exposed to a plasma may be an etching process for forming a recess in the low-dielectric-constant film and/or an ashing process for ashing an organic resist film formed on the low-dielectric-constant film.

A workpiece on which the low-dielectric-constant film is formed is held in a vacuum atmosphere throughout a damaged layer formable process and the repairing process.

The damaged layer formable process and the repairing process may be carried out in a single processing vessel.

The $CH_3$ radical source gas may be any one of gases of di-t-alkyl peroxide (($CH_3)_3COOC(CH_3)_3$), methane ($CH_4$), azomethane (($CH_3)_2N_2$ and ($CH_3)_3N$), 2,2'-azobis isobutylnitrile (($CH_3)_2C(CN)N\!\!=\!\!N(CN)C(CH_3)_2$), dimethylamine (($CH_3)_2NH$) and neopentane ($C(CH_3)_4$).

A semiconductor device fabricating system according to the present invention includes: a processing vessel; a stage placed in the processing vessel to support a workpiece thereon; an evacuating means for evacuating the processing vessel; and a $CH_3$ radial supplying means for producing $CH_3$ radicals by supplying energy to a $CH_3$ radical source gas and supplying $CH_3$ radials to the workpiece supported on the stage; wherein a damaged layer, from which carbon atoms have been eliminated, formed in a low-dielectric-constant film formed on the workpiece and containing silicon, carbon, oxygen and hydrogen may be repaired by bonding $CH_3$ radicals to the damaged layer.

In the semiconductor device fabricating system according to the present invention, the $CH_3$ radical supplying means produces $CH_3$ radicals through the thermal decomposition of the $CH_3$ radical source gas.

In the semiconductor device fabricating system according to the present invention, the $CH_3$ radical supplying means may be provided with a supply opening through which a gas containing $CH_3$ radicals is supplied sideways to the workpiece.

In the semiconductor device fabricating system according to the present invention, the $CH_3$ radical supplying means for supplying $CH_3$ radicals to the workpiece may be provided with a gas supply device disposed opposite to the stage to supply a $CH_3$ radical source gas.

The semiconductor device fabricating system according to the present invention may further include: a plasma source gas supplying means for supplying a plasma source gas into a processing vessel; and a plasma generating means for generating a plasma from the plasma source gas; wherein the workpiece is processed by a process using the plasma, and then a damaged layer damaged by the process using the plasma in the low-dielectric-constant film is repaired.

The semiconductor device fabricating system according to the present invention may further include: a plasma-processing vessel; a plasma source gas supplying means for supplying a plasma source gas into the plasma-processing vessel; a plasma generating means for generating a plasma from the plasma source gas in the plasma-processing vessel; a vacuum transfer chamber having ends connected to a damaged layer repairing vessel and the plasma-processing vessel, respectively; and a carrying means placed in the transfer chamber and capable of moving between the plasma-processing vessel and the damaged layer repairing vessel to carry the workpiece between the plasma-processing vessel and the damaged layer repairing vessel; wherein the workpiece is subjected to a plasma-processing process using a plasma, and then a damaged layer damaged by the plasma-processing process using a plasma in a low-dielectric-constant film is repaired.

In the semiconductor device fabricating system according to the present invention, the plasma-processing process may be an etching process for forming a recess in the low-dielectric-constant film and/or an ashing process for ashing an organic resist film formed on the low-dielectric-constant film.

A storage medium according to the present invention stores a computer program for controlling a system for repairing a damaged layer, from which carbon atoms have been eliminated, in a low-dielectric-constant film containing silicon, carbon, oxygen and hydrogen; wherein the computer program includes instructions to be executed to accomplish the steps of the foregoing damaged layer repairing method.

The present invention can repair a damaged layer damaged by decarbonization of a low-dielectric-constant film containing silicon, carbon, oxygen and hydrogen by supplying $CH_3$ radicals to the damaged layer to introduce carbon atoms into the damaged layer to suppress the deterioration of the quality of the low-dielectric-constant film. $CH_3$ radicals can penetrate into the depth of, for example, a porous film to repair the damaged porous film. Since $CH_3$ radicals have a long lifetime, the damaged layer can be repaired in a high intrasurface uniformity.

BRIEF DESCRIPTION OF THE DRAWINGS

The above and other objects, features and advantages of the present invention will become more apparent from the following description taken in connection with the accompanying drawings, in which:

FIGS. 4A, 4B, 4c and 4D are typical sectional views of a wafer in steps of a plasma-processing process;

FIGS. 5A and 5B are diagrammatic views illustrating a reaction mechanism to be carried out in a repairing step according to the present invention;

DESCRIPTION OF THE PREFERRED EMBODIMENTS

Figure 1:
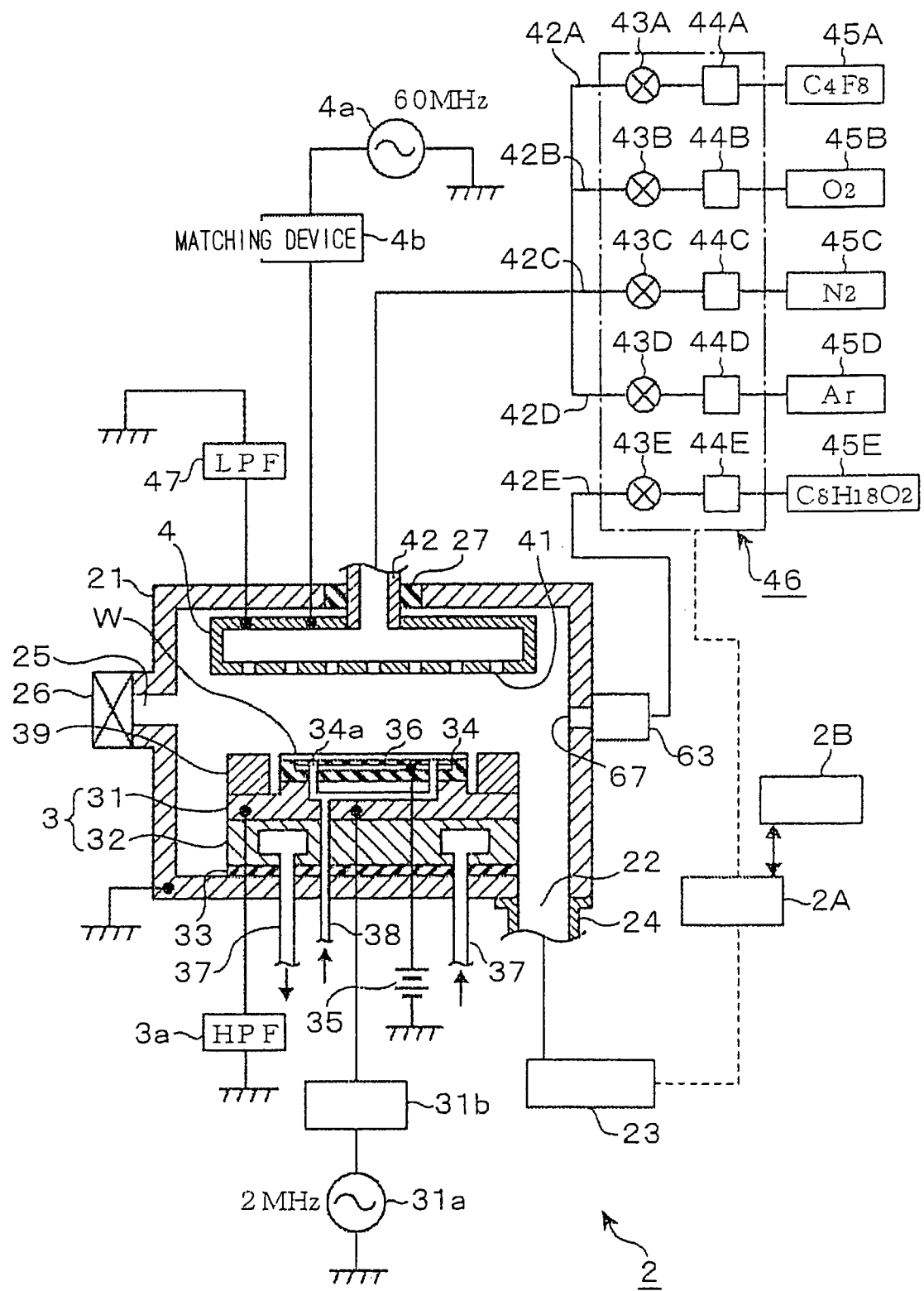
FIG. 1 is a schematic longitudinal sectional view of a plasma processing system in a preferred embodiment according to the present invention.
Figure 2:
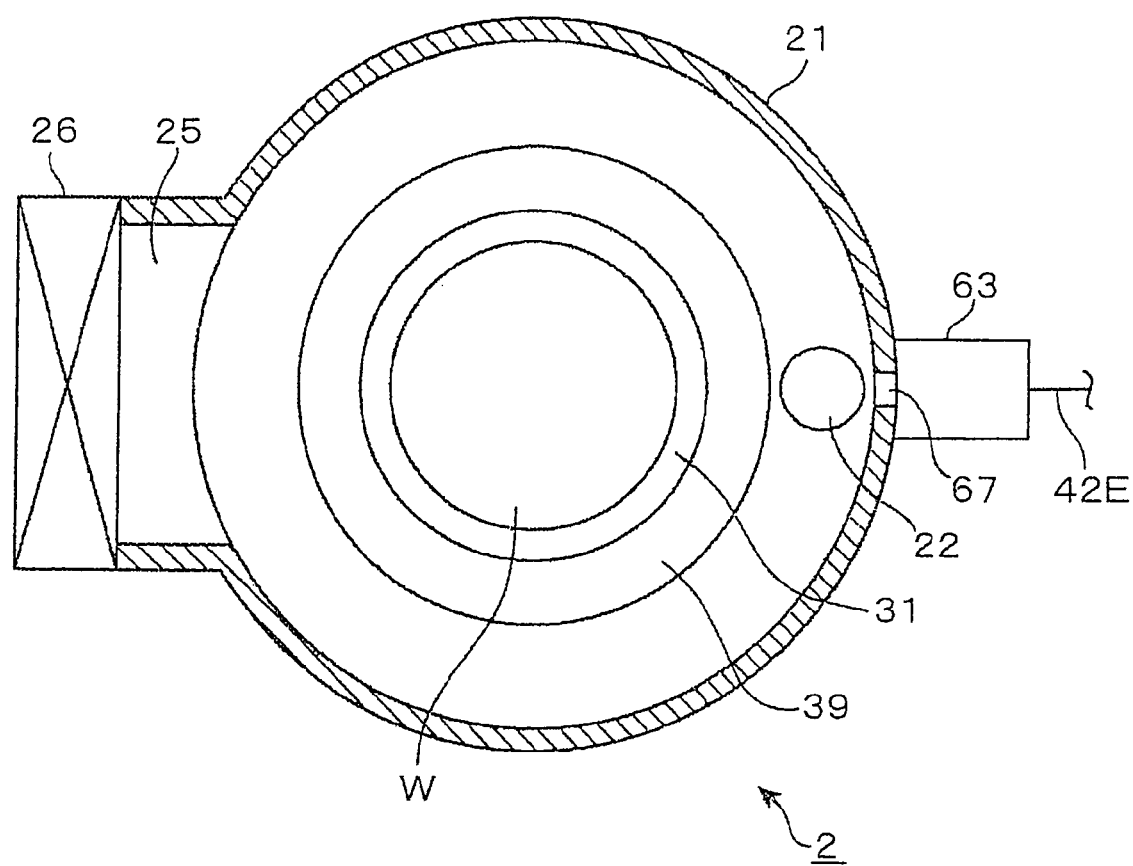
FIG. 2 is a cross-sectional view of the plasma processing system shown in FIG. 1.

A plasma-processing system 2 for carrying out a damaged layer repairing method in a preferred embodiment according to the present invention will be described with reference to FIGS. 1 and 2. The plasma-processing system 2 processes a wafer W by an etching process and an ashing process and is capable of carrying out a damaged layer repairing method of repairing a damaged SiOCH film. Referring to FIG. 1, the plasma-processing system 2 includes a processing vessel 21, such as a plasma-processing vessel defining a sealed vacuum chamber, a stage 3 disposed in the processing vessel 21 on a central part of the bottom wall of the processing vessel 21, and an upper electrode 4 disposed above the stage 3 opposite to the stage 3.

The processing vessel 21 is electrically grounded. An evacuating unit 23 is placed in an exhaust pipe 24 connected to an exhaust port 22 formed in the bottom wall of the processing vessel 21. A pressure adjusting unit, not shown, is connected to the evacuating unit 23. The pressure adjusting unit is controlled by signals given thereto by a controller 2A to evacuate the processing vessel 21 so as to maintain the interior space of the processing vessel 21 at a desired vacuum. An opening 25 is formed in the side wall of the processing vessel 21. The opening 25 is opened and closed by a gate valve 26.

A heater block is attached to the inside surface of the side wall of the processing vessel 21. The heater block maintains the inside surface of the processing vessel at a temperature of 60° C. or above to prevent the deposition of fluorocarbon and such on the inside surface of the processing vessel 21. The description of the heater block will be omitted.

The stage 3 includes a lower electrode 31 and a support member 32 supporting the lower electrode 21 thereon. The stage 3 is mounted on an insulating member 33 placed on the bottom wall of the processing vessel 21. An electrostatic chuck 34 of an insulating material is placed on top of the stage 3. The electrostatic chuck 34 holds a wafer W on the stage 3. The electrostatic chuck 34 is internally provided with an electrode foil 36. The electrode foil 36 is connected to a high-voltage dc power source 35. The high-voltage dc power source 35 applies a voltage to the electrode foil 36 to generate static electricity on the surface of the electrostatic chuck 34. The wafer W mounted on the stage 3 is held on the stage 3 by the electrostatic attraction of the electrostatic chuck 34. The electrostatic chuck 34 is provided with through holes 34a. A backside gas is spouted upward through the through holes 34a.

The stage 3 is internally provided with a coolant passage 37. A coolant, such as a fluorine-contained coolant or water, is passed through the coolant passage 37 to cool the stage 3 so that the wafer W supported on the stage 3 may be cooled at a desired temperature. A temperature sensor, not shown, is attached to the lower electrode 31 to monitor continuously the temperature of the wafer W placed on the lower electrode 31.

The stage 3 is internally provided with a gas passage 38 connected to the through holes 34a opening at a plurality of positions in the upper surface of the stage 3. A heat-conducting gas, such as He is supplied as a backside gas into the gas passage 38 to spout the backside gas upward through the through holes 34a. The spouted backside gas spreads uniformly in the space between the electrostatic chuck 34 and the wafer W held on the electrostatic chuck 34 to enhance heat conduction in the space.

The lower electrode 31 is grounded through a high-pass filter (HPF) 3a. A high-frequency power source 31a is connected through a matching device 31b to the lower electrode 31 to supply power of a second high frequency of, for example, 2 MHz.

A focusing ring 39 is placed on a peripheral part of the lower electrode 31 so as to surround the electrostatic chuck 34. When a plasma is produced, the focusing ring 39 concentrates the plasma on the wafer W held on the stage 3.

The upper electrode 4 is a hollow structure serving as a gas shower head. The upper electrode 4 has a bottom wall provided with a plurality of spouting holes 41 formed in a uniform arrangement. A process gas spouted through the spouting holes 41 disperses in the processing vessel 21. A gas supply pipe 42 is connected to a central part of the upper wall of the upper electrode 4. The gas supply pipe 42 penetrates the upper wall of the processing vessel 21. The gas supply pipe 42 is insulated from the upper wall of the processing vessel 21 by an insulating member 27. Four branch pipes 42A to 42D branch out from an upstream part of the gas supply pipe 42. The branch pipes 42A to 42D are connected through valves 43A to 43D and flow controllers 44A to 44D to gas sources 45A to 45D, respectively. A gas supply pipe 42E is connected trough a valve 43E and a flow controller 44E to a gas source 45E. The valves 43A to 43E and the flow controllers 44A to 44E constitute a gas supply system 46. Supply of the gases from the gas sources 45A to 45E and the respective flow rates of the gases can be controlled by control signals given to the gas supply system by the controller 2A. The branch pipes 42A to 42D, the gas supply system 46 and the gas sources 45A to 45D constitute a plasma source gas supply system.

The upper electrode 4 is grounded through a low-pass filter (LPF) 47. A high-frequency power source 4a is connected through a matching device 4b to the upper electrode 4 to supply power of a first high frequency of, for example, 60 MHz, which is higher than the first frequency, to the upper electrode 4.

A high-frequency wave generated by the high-frequency power source 4a connected to the upper electrode 4 is a first high-frequency wave. The first high-frequency wave is used for ionizing the process gas. A high-frequency wave generated by the high-frequency power source 31a connected to the lower electrode 31 is a second high-frequency wave. The second high-frequency wave is used for supplying a bias power to the wafer W to attract ions of a plasma to the surface of the wafer W. The upper electrode 4 and the lower electrode 31 constitute an ionizing system for ionizing a plasma source gas. The controller 2A is connected to the high-frequency power sources 4a and 31a to control the respective magnitudes of power to be supplied to the upper electrode 4 and the lower electrode 31 by the high-frequency power sources 4a and 31a, respectively.

Figure 3:
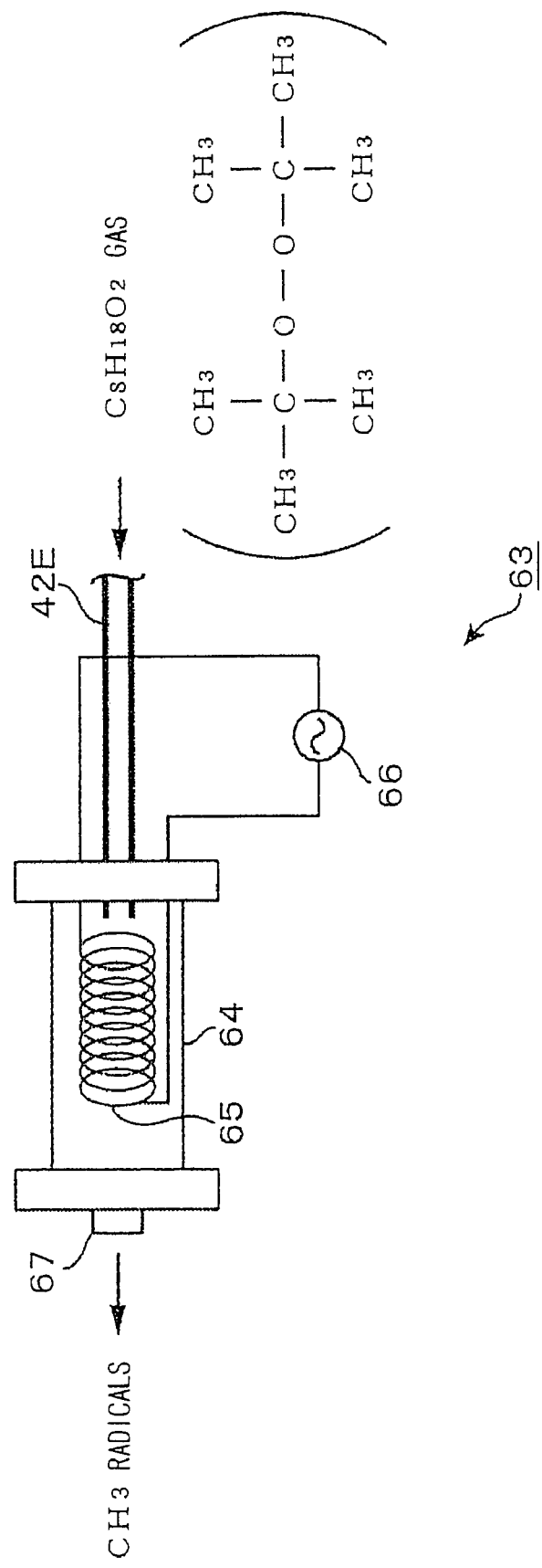
FIG. 3 is a schematic side elevation of a $CH_3$ radical producing device according to the present invention.

A $CH_3$ radical source gas is supplied through the gas heating device 63 into the processing vessel 21. The gas heating device 63 is attached to the side wall of the processing vessel 21. As shown in FIG. 3, the gas heating device 63 has a cylindrical case 64, a heating element 65 longitudinally extended inside the case 64 and connected to a power source 66, and a supply port 67. The gas heating device 63 has a right end, as viewed in FIG. 3, connected to a gas supply pipe 42E and a left end, as viewed in FIG. 3, connected to the processing vessel 21. The $CH_3$ radical source gas flows leftward, as viewed in FIG. 3, and is supplied through the supply port 67 into the processing vessel 21. The heating element 65 is, for example, a heating coil of a tungsten filament capable of heating the $CH_3$ radical source gas at, for example, 1000° C. The $CH_3$ radical source gas supplied from the gas source 45E through the gas supply pipe 42E into the heating device 63 is decomposed by heat into radicals. The radicals thus produced are supplied through the supply port 67 into the processing vessel 21. The gas heating device 63, the gas supply pipe 42E, the gas supply system 46 and the gas source 45E constitute a $CH_3$ radical supply system for applying $CH_3$ radicals to a workpiece. The case 64 is provided with a quartz window, not shown. The temperature of the heating element 65 may be measured by a radiation thermometer, not shown, from outside the case 64, and the temperature of the heating element 65 may be controlled on the basis of the measured temperature.

The controller 2A of the plasma-processing system 2 is, for example, a computer. The controller 2A includes a CPU, namely, a data processing unit storing a program, and a memory. The program has instructions for the controller 2A to execute. The controller 2A gives control signals to the components of the plasma-processing system 2 according to the program to make the plasma-processing system 2 execute steps of a plasma-processing process, which will be described later, to process the wafer W by the plasma-processing process. The memory has memory areas holding values of process parameters including process pressure, processing time, gas flow rate and electric power. The CPU reads the values of those process parameters to execute the instructions of the program. The controller 2A gives control signals representing the values of those process parameters to the components of the plasma-processing system 2. The program, which includes a program holding instructions specifying operations for entering the process parameters and displaying information, is stored in a storage device 2B, namely, a computer-oriented storage medium, such as a flexible disk, a compact disk, a magnetooptical disk (MO disk) or a hard disk (HD). The storage device 2B is installed in the controller 2A.

A semiconductor device fabricating method in a preferred embodiment according to the present invention will be described. The semiconductor device fabricating method uses the plasma-processing system. The gate valve 26 is opened, a 200 mm diameter (12 in. diameter) wafer W is carried into the processing vessel 21 by a carrying mechanism, not shown. The wafer W is placed horizontally on the stage 3 and the, the wafer W is held fixedly by electrostatic attraction. The carrying mechanism is retracted from the processing chamber 21, and then the gate valve 26 is closed. Subsequently, the backside gas is supplied through the gas passage 38 to adjust the temperature of the wafer W to a predetermined temperature. Then, the following steps are executed.

FIG. 4A shows a layered structure formed on a surface of the wafer W. In this example, copper wiring lines are formed by a dual damascene process shown in FIG. 4A are a Cu wiring line 56, a SiC film 53 serving as an etch stopper, a SiOCH film 54 serving as a layer insulating film, a SiO$_2$ film serving as a hard mask, a resist mask 51 and an aperture 555.

Step 1 (Etching Process)

The evacuating unit 23 evacuates the processing vessel 21 at a predetermined vacuum through the exhaust pipe 24. Then, the gas supply system 46 supplies, for example, C$_4$F$_8$ gas, nitrogen gas (N$_2$) and Ar gas into the processing vessel 21. A first high-frequency wave of, for example, 60 MHz and 1200 W is supplied to the upper electrode 4 and a plasma of the process gas is generated from the process gas, namely, a mixed gas of C$_4$F$_8$ gas, nitrogen gas (N$_2$) and Ar gas. A second high-frequency wave of, for example 2 MHz and 1200 W is supplied to the lower electrode 31.

The plasma contains active species of a compound of carbon and fluoride. When the SiO$_2$ film 59 and the SiOCH film 54 are exposed to the plasma containing the active species, the active species react with atoms contained in those films 54 and 59 to produce a compound. Thus the SiO$_2$ film 59, the SiOCH film 54 and the SiC film 53 are etched and a recess 57 is formed as shown in FIG. 4B. As mentioned above, carbon atoms are eliminated from the SiOCH film 54 formed on the side surfaces of the recess 57 and exposed to the plasma, and a damaged layer 60 is formed as shown in FIG. 4B.

Step 2 (Ashing Process)

Power supply from the high-frequency power sources 4a and 31a is stopped to stop producing a plasma in the processing vessel 21 and the gas supply system 46 stops supplying the gases. Subsequently, the evacuating unit 23 evacuates the processing vessel 21 and holds a predetermined vacuum in the processing vessel 21.

The gas supply system 46 supplies, for example, oxygen gas (O$_2$) into the processing vessel 21, and a plasma is generated from the oxygen gas by supplying a first high-frequency wave of, for example, 60 MHz and 300 W to the upper electrode 4, and a second high-frequency wave of, for example, 2 MHz and 300 W is supplied to the lower electrode 31.

An ashing process uses the plasma thus produced for ashing and removing the resist mask 51 as shown in FIG. 4C.

It is expected that the thickness of the damaged layer 60 increases when the damaged layer 60 is exposed to the plasma during the ashing process.

Step 3 (Repairing Process)

The gas supply system 46 stops supplying the gas into the processing vessel 21 after the high-frequency power sources 4a and 31a have stopped supplying power to the upper electrode 4 and the lower electrode 31 to stop producing the plasma. Then, the evacuating unit 23 evacuates the processing vessel 21 and keeps the processing vessel 21 at a predetermined vacuum between 1 Pa (7.5 mtorr) and 10 Pa (75 mtorr). Meanwhile, the power source 66 supplies power to the heating element 65, namely, the coil of a tungsten filament, of the heating device 63 to hold the heating element 65 at 1000° C.

The gas source 45E supplies a radical source gas, namely, C$_8$H$_{18}$O$_2$ gas (di-t-alkyl peroxide gas) represented by a structural formula: (CH$_3$)$_3$COOH(CH$_3$)$_3$, through the gas supply pipe 42E to the gas heating device 63. The radical source gas is decomposed by heat generated by the heating element 65. The radical source gas heated by the heat of the heating element 65 is converted into CH$_3$ radicals by a reaction mechanism expressed by Expressions (1) and (2).

$$C_8H_{18}O_2 \rightarrow 2(CH_3)_3CO \tag{1}$$

$$(CH_3)_3CO \rightarrow (CH_3)_2CO + CH_3 \tag{2}$$

CH$_3$ radicals thus produced are supplied into the processing vessel 21.

The CH$_3$ radicals are supplied continuously into the processing vessel 21 for a time of, for example, 20 min. Consequently, the damaged layer 60 formed in the SiOCH film 54 by the damaging effect of the plasmas in the etching process and the ashing process is repaired as shown in FIG. 4D. A repairing process by which the damaged layer 60 is repaired is expressed by Expressions (3) and (4).

$$SiO^- + \cdot CH_3 \rightarrow SiOCH_3 \tag{3}$$

$$SiO_2 + \cdot CH_3 \rightarrow SiOCH_3 + O^- \tag{4}$$

A chemical symbol ".CH$_3$" indicates a CH$_3$ radical. FIGS. 5A and 5B show this reaction mechanism expressed by Expressions (3) and (4). As shown in FIG. 5A, the plasmas used in the etching and the ashing process destroy Si—C bonds in a surface layer and eliminates C atoms, and Si atoms having dangling bonds are produced. Si atoms having dangling bonds are produced also in the SiOCH film 54. The depth of a layer containing Si atoms having dangling bonds, namely, the thickness of the damaged layer 60, is greater when the amount of the plasma to which the SiOCH film 54 is exposed is larger. Usually, the Si atoms having dangling bonds and moisture contained in the atmosphere bond together to produce Si—OH bonds.

When the surface of the SiOCH film 54 having the Si atoms having dangling bonds is exposed to CH$_3$ radicals, Si—CH$_3$ bonds are produced as shown in FIG. 5B. Since the SiOCH film 54 is a porous film, CH$_3$ radicals can penetrate deep into the SiOCH film 54. Since the CH$_3$ groups bonded to the surface of the SiOCH film 54 are small and hence cause steric hindrance scarcely to CH$_3$ radicals penetrating into the SiOCH film 54. Therefore, CH$_3$ radicals can penetrate deep into the SiOCH film 54 and can bond to Si atoms having dangling bonds to produce Si—CH$_3$ bonds after the Si—CH$_3$ bonds have been formed on the surface of the SiOCH film 54. Thus the damaged layer 60 can be repaired.

Atoms of a CH$_3$ radical are arranged in a plane and hence a deposit is formed scarcely on the surface of the SiOCH film 54. Therefore, CH$_3$ radicals ca selectively bond to Si atoms having dangling bonds.

Since CH$_3$ radicals do not react with each other and with other compounds produced by the decomposition of C$_8$H$_{18}$O$_2$ or repaired dangling bonds, the damaged layer 60 formed on the surface of the wafer W can be repaired in a high intrasurface uniformity even if the wafer W is exposed irregularly to CH$_3$ radicals because the wafer W is held for a long time in the processing vessel 21.

Although $CH_3$ radicals are supplied into the processing vessel through the single supply port 67, a plurality of supply ports may be arranged in a circumferential arrangement on the side wall of the processing vessel 21. It is expected that the damaged layer 60 can be repaired in a still higher intrasurface uniformity if $CH_3$ radicals are supplied into the processing vessel 21 through the plurality of supply ports. Since radicals can be supplied at a higher supply rate into the processing vessel 21 and hence the damaged layer 60 can be quickly repaired when $CH_3$ radicals are supplied into the processing vessel through the plurality of supply ports. A plurality of exhaust ports 22 may be formed in the bottom wall of the processing vessel 21 in a circumferential arrangement to improve the intrasurface uniformity of the repairing effect of $CH_3$ radicals still further.

Compounds other than $CH_3$ radicals produced through the reaction mechanism expressed by Expressions (1) and (2) react with the SiOCH film 54 at a low provability. Therefore, it is expected that the compounds are discharged through the exhaust ports 22 without practically acting on the SiOCH film 54.

Any suitable gas that selectively produces $CH_3$ radicals, and produces a small amount of CH, $CH_2$ and C, which have large attachment coefficients with the SiOCH film 54 and the like, may be used instead of $C_8H_{18}O_2$ gas for producing $CH_3$ radicals. Possible $CH_3$ radical source gases are, for example, methane ($CH_4$), azomethanes (($CH_3)_2N_2$) and ($CH_3)_3N$), 2,2'-azobis iso-butylnitrile (($CH_3)_2C(CN)N=N(CN)C(CH_3)_2$), dimethylamine (($CH_3)_2NH$), and neopentane ($C(CH_3)_4$). Although this embodiment decomposes the $CH_3$ radical source gas by thermal decomposition using heat generated by the heating element 65, namely, the coil of a tungsten filament, the $CH_3$ radical source gas may be decomposed by other decomposition process that produces only a small amount of CH, $CH_2$ and C, and selectively produces $CH_3$, such as a catalytic CVD process or a photodecomposition process.

After the SiOCH film 54 has been thus repaired, for example, the recess 57 is filled up with an organic film as a sacrificial film, and Cu is embedded in the organic film formed in the recess 57 to build a wiring structure.

The foregoing embodiment processes the SiOCH film 54 by the etching and the ashing process, namely, plasma-processing processes, and then repairs the damage layer 60 formed by damaging a surface layer of the SiOCH film 54 by the plasma-processing processes by the repairing process using $CH_3$ radicals. The composition of the repaired SiOCH film 54 is similar to that of the original SiOCH film 54. thus the reduction of the dielectric constant of the SiOCH film 54 can be suppressed. Consequently, a semiconductor device having expected electrical characteristics can be fabricated.

As will be obvious from the following experiments, the repairing process can repair side walls of recesses, such as grooves, formed in a surface of a wafer W and can repair damaged layers on the side walls of grooves having a narrow width on the order of 180 nm.

The repairing process using $CH_3$ radicals does not exert a bad effect on other films, the characteristics of the semiconductor device and the plasma-processing system 2. Therefore, the repairing process for repairing the damaged layer 60 in the SiOCH film 54 can be continued for a time long enough to obtain a semiconductor device having electrical characteristics at a desired level.

The plasma-processing system 2 in this embodiment can continuously accomplish the etching process for etching the SiOCH film 54, the ashing process and the repairing process in the processing vessel 21 without taking the wafer W from and returning the same into the processing vessel 21 only by changing process conditions including process gases and process pressures. Therefore, the repairing process can be accomplished without requiring an OH group removing process after the plasma-processing process by suppressing the bonding of OH groups to the dangling bonds of Si atoms. Thus the plasma-processing system 2 is advantageous in throughput and installation space. The repairing process may be executed after the completion of both the etching and the ashing process or after the completion of each of the etching and the ashing process.

The wafer W subjected to the plasma-processing process according to the present invention may be provided with the resist mask 51 formed contiguously on an insulating film, such as the SiOCH film 54 or may be provided with an antireflection film formed between a hard mask, such as the $SiO_2$ film, formed on an insulating film, such as the SiOCH film 54, and the resist mask 51.

The repairing process of the present invention is applicable not only to repairing the damaged layer 60 in the SiOCH film 54, but also to repairing a damage layer of a film containing Si, O, C and H and subject to the elimination of C atoms when exposed to a plasma or radiation, such as light, such as an MSQ film (methyl-hydrogen-silses-quixane film) pt sm HSQ film (hydrogen-silses-quioxane film).

An organic film formed on a film, such as a layer insulating film provided with recesses formed by etching and to be removed by an ashing process can be modified by a process using $CH_3$ radicals to obtain an organic film highly resistant to a plasma used by an etching process.

The present invention is not limited in its application only to processing the SiOCH film 54 processed by the etching and the ashing process. For example, the present invention may be applied to an after-treatment process for processing the SiOCH film 54 damaged by a process for removing a layer deposited on the SiOCH film 54.

According to the present invention, the method of producing $CH_3$ radicals is not limited to the thermal decomposition of C8H18O2 gas; $CH_3$ radicals may be produced through the thermal decomposition of any one of the foregoing gases having $CH_3$ groups. The method of decomposing the $CH_3$ radical source gas is not limited to thermal decomposition, and the $CH_3$ radical source gas may be decomposed by photodecomposition.

The plasma-processing system 2 may be of a bottom electrode type that supplies the first high-frequency wave for ionizing the process gas to the lower electrode 21 instead of to the upper electrode 4.

The plasma-processing system 2 in this embodiment is provided with the gas heating device 63 disposed outside the processing vessel 21. The heating element 65 may be placed inside the processing vessel 21 to produce $CH_3$ radicals by heating the $CH_3$ radical source gas supplied into the processing vessel 21 inside the processing vessel 21.

Figure 6:
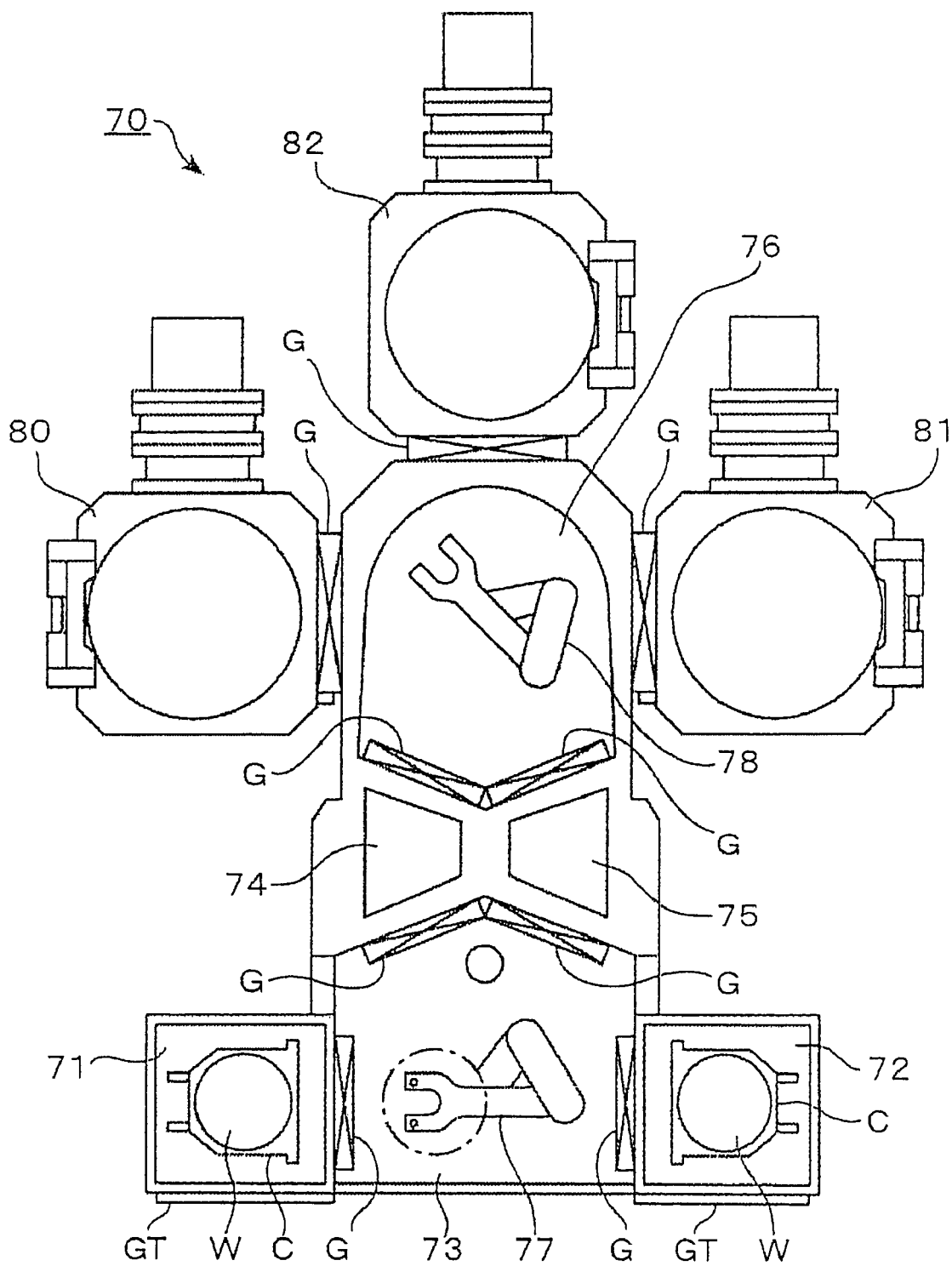
FIG. 6 is a typical view of a semiconductor device fabricating system in a preferred embodiment according to the present invention.

The plasma processing system 2 is provided with the gas heating device 63 and carries out both the plasma-processing process and the radical-processing process in the processing vessel 21. The plasma-processing process and the radical-processing process may be carried out in separate processing vessels, respectively. FIG. 6 shows a semiconductor device fabricating system 70 called a cluster tool or multichamber semiconductor device fabricating system provided with a plurality of processing vessels. Shown in FIG. 6 are carrier holding units 71 and 72 provided with gate doors GT, respectively, for holding a carrier C, namely, a container for containing wafers W for carrying, a first transfer chamber 73, spare vacuum chambers 74 and 75, and a second transfer chamber 76. These units and chambers are air-tight structures isolated from the atmosphere, and can be evacuated to produce a vacuum atmosphere or an inert atmosphere. The gate doors GT of the carrier holding units 71 and 72 are opened to carry a carrier C into the carrier holding units 71 and 72. Shown also in FIG. 6 are a first carrying device 77, and a second carrying device 78 for carrying a workpiece between a processing vessel for carrying out a plasma-processing process and a processing vessel for carrying out a damaged layer repairing process. A plasma-processing unit 80 and a radial-processing unit 81 are connected in an air-tight fashion to the second transfer chamber 76. A damaged layer 60 formed by a plasma-processing process is repaired by the radical-processing unit 81 using radicals. The plasma-processing unit 80 includes a processing vessel, not shown, for the plasma-processing process. A gas supply pipe, not shown is connected to the processing vessel. A gas to be ionized to produce a plasma is supplied through the gas supply pipe into the processing vessel. A pair of high-frequency electrodes, not shown, is placed in the processing vessel. The high-frequency electrodes are ionizing means for ionizing the gas supplied through the gas supply pipe into the processing vessel to produce a plasma. As shown in FIG. 6, the semi device fabricating system 70 may be provided with a processing unit like the plasma-processing unit 80 or the radical-processing unit 81.

In the semiconductor device fabricating system 70 shown in FIG. 6, the first carrying device 77 takes out a wafer W from the carrier C and carries the wafer W to the spare vacuum chamber 74 (or 75), and then the second carrying device 78 carries the wafer W from the spare vacuum chamber 74 (or 75) to the plasma-processing unit 80. The plasma-processing unit 80 processes the wafer W by the foregoing plasma-processing processes, such as the etching process and the ashing process. Then, the second carrying device 78 carries the wafer W to the radical-processing unit 81. The radical-processing unit 81 processes the wafer W by the foregoing repairing process. he Bonding of OH groups and the like to the dangling bonds of Si atoms can be suppressed by creating a vacuum atmosphere created in the second transfer chamber 76 during those operations. Although it is preferable to create a vacuum atmosphere in the second transfer chamber 76, an inert atmosphere of a gas not containing oxygen, such as Ar gas or nitrogen gas, may be created in the second transfer chamber 76.

Figure 7A:
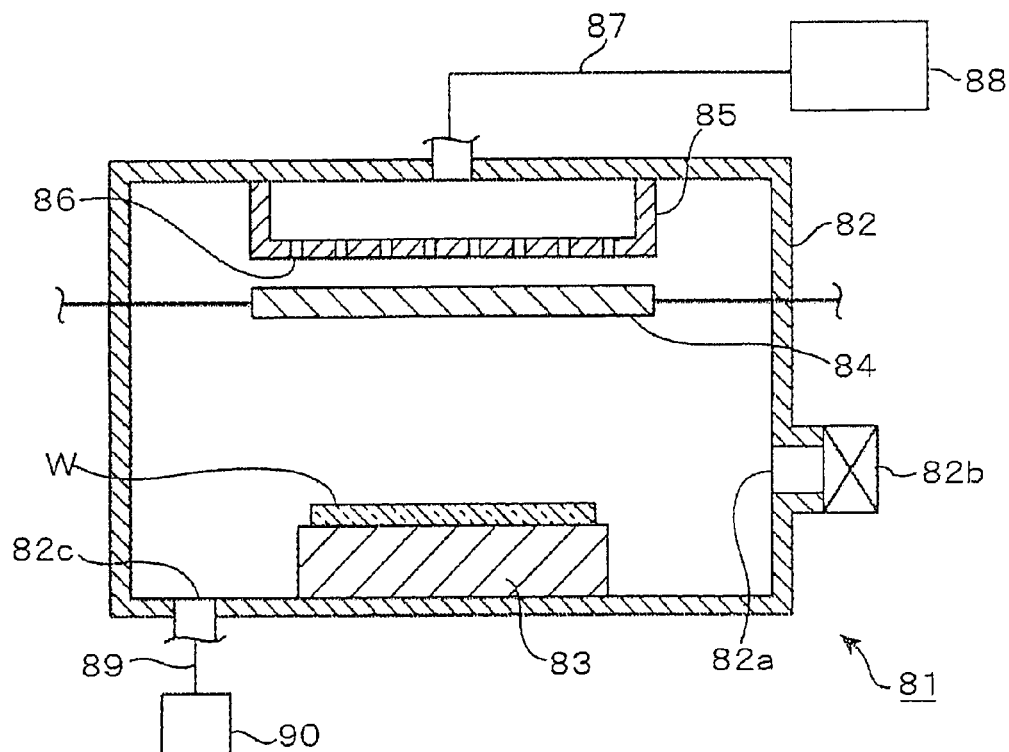
FIGS. 7A and 7B are a schematic sectional view and a schematic cross-sectional view, respectively, of a radical processing device according to the present invention.
Figure 7B:
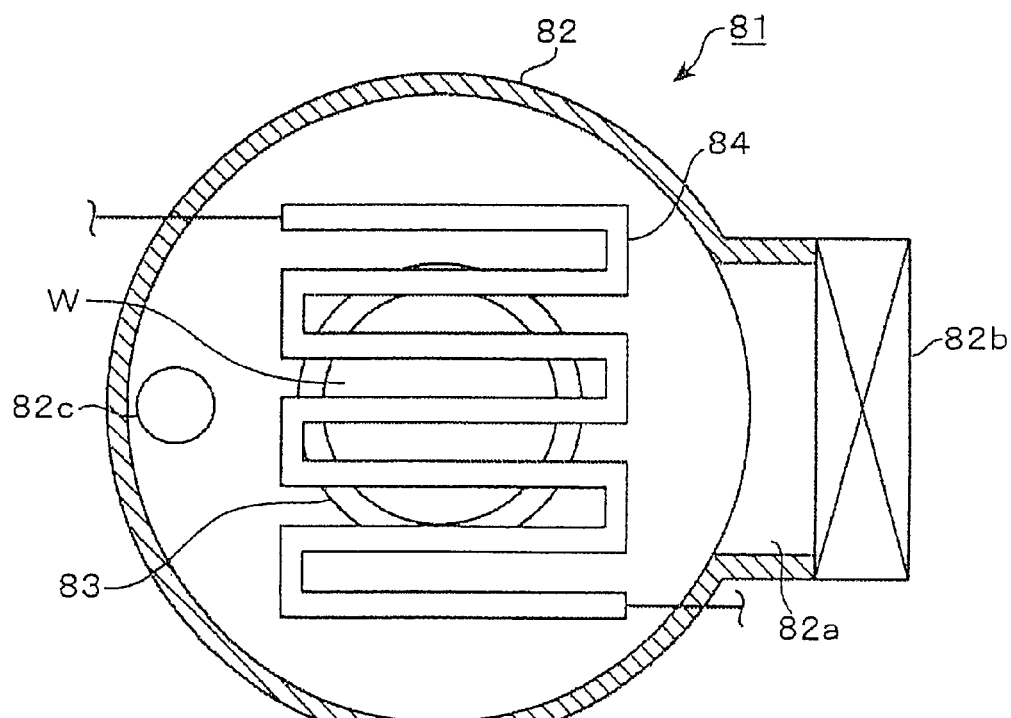

The radical-processing unit 81 for processing the wafer W by the repairing process will be briefly described with reference to FIGS. 7A and 7B. Referring to FIG. 7A, the radical-processing unit 81 has a processing vessel 82, such as a radical-processing vessel defining a sealed vacuum chamber. A stage 83, a heating element 84 and a gas supply device 85 for supplying a $CH_3$ radical source gas into the processing vessel 82 are disposed in the processing vessel 82. An opening 82a is formed in the side wall of the processing vessel 82 and is closed by a gate valve 82b. The wafer W is transferred through the opening 82a between the stage 83 and the second carrying device 78. An exhaust pipe 89 is connected to an outlet 82c formed in the bottom wall of the processing vessel 82. An exhaust device 90 evacuates the processing vessel 82 through the exhaust pipe 89. The stage 83 is provided with a temperature sensor, not shown, and is internally provided with a cooling mechanism, not shown, for cooling the wafer W to control the temperature of the wafer W. The gas supply device 85 is provided with a plurality of small pores 86. A gas supplied from a gas source 88 through a gas supply pipe 87 to the gas supply device 85 is discharged uniformly toward the stage 83. The heating element 84, such as a tungsten filament, is disposed between the stage 83 and the gas supply device 85. As shown in FIG. 7B, the heating element 84 is connected to a power source, not shown, installed outside the processing vessel 82. The heating element 84 is formed in a zigzag shape having a large contact area to heat the gas supplied from the gas source 85 for thermal decomposition.

The second carrying device 78 carries the wafer W through the opening 82a of the processing vessel 83 onto the stage 83. The wafer W delivered to the stage 83 is held on the stage by an electrostatic chuck incorporated into the stage 83. Then, the exhaust device 90 evacuates the processing vessel 82 through the exhaust pipe 89 at a predetermined vacuum. The gas source 88 supplies $C_8H_{18}O_2$ gas, namely, a radical source gas, through the gas supply pipe 87 into the processing vessel 82. Heat generated by the heating element 84 heated beforehand at, for example, 1000° C. decomposes the $C_8H_{18}O_2$ gas to produce mainly $CH_3$ radicals. The $CH_3$ radicals act on the wafer W to repair a damaged layer 60 on the wafer W by the foregoing repairing process. The repairing process is continued for a predetermined time. After the accomplishment of the repairing process, the wafer W is carried by a returning procedure reverse to a feeding procedure by which the wafer W is carried to the processing vessel 82 to carry away the wafer W from the radical-processing unit 81 and the semiconductor device fabricating system 70.

The plasma-processing unit 80 thus constructed can accomplish processing the wafer W in a short time and improves the productivity of the semiconductor device fabricating system 70. Since the radicals fall onto the wafer W in a highly uniform distribution, the surface of the wafer W can be repaired in an intrasurface uniformity.

This embodiment produces $CH_3$ radicals in the processing vessel 82 in which the wafer W is subjected to the repairing process. An external gas decomposing unit internally provided with the heating element 84 may be used to produce $CH_3$ radicals through the thermal decomposition of the $CH_3$ radical source gas, and $CH_3$ radicals produced by the external gas decomposing unit may be supplied into the processing vessel.

EXAMPLES

Experiments conducted to verify the effects of the present invention will be described. Experiments used the plasma-processing system 2 shown in FIG. 1. A QMS (quadrupole mass spectrometer) was held on the side wall of the processing vessel 21 to determine the types of radicals flowing in the processing vessel 21.

Experiment 1

Experiment 1 was conducted to determine the dependence of the repairing effect of the repairing process on processing time.

Figure 8A:
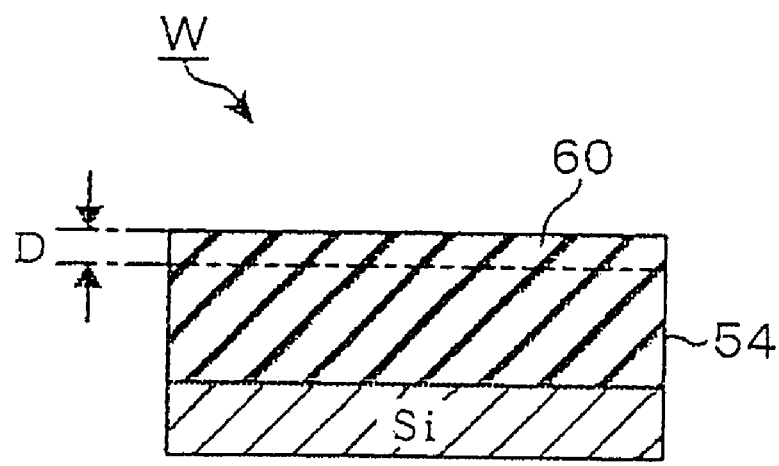
FIGS. 8A and 8B are typical sectional views of a wafer in steps of an experiment.

Test wafers W were prepared by coating surfaces of 8 in. (200 mm) diameter bear silicon wafers entirely with a SiOCH film 54 as shown in FIG. 8A. The test wafers W were subjected to a plasma-processing process under the following process conditions to form a damaged layer 60 on each test wafer W. The plasma-processing process was supposed to be the etching process executed in Step 1 or the ashing process executed in Step 2.

Conditions for Plasma-processing Process

Frequency of wave (Upper electrode 4): 60 MHz
Power supplied to the upper electrode 4: 300 W
Frequency of wave (Lower electrode 31): 2 MHz
Power supplied to the lower electrode 31: 0 W
Process pressure: 1.3 Pa (9.75 mtorr)
Process gas: $O_2$ (300 sccm)
Processing time: 10 s The test wafers W processed by the plasma-processing process were subjected to a repairing process under the following process conditions.

Conditions for Repairing Process
Process gas: $C_8H_{18}O_2$ gas (300 sccm)
Process pressure: 5.3 Pa (39.75 mtorr)
Temperature of the heating element 65: 1000° C.
Processing time: 1, 3, 5, 7, 9, 15 and 25 min A wafer in a comparative example was obtained by subjecting a wafer having a surface coated with the SiOCH film 54, and processing the wafer by the plasma-processing process. The wafer in the comparative example was not processed by the repairing process.

Results of Experiments

Figure 9A:
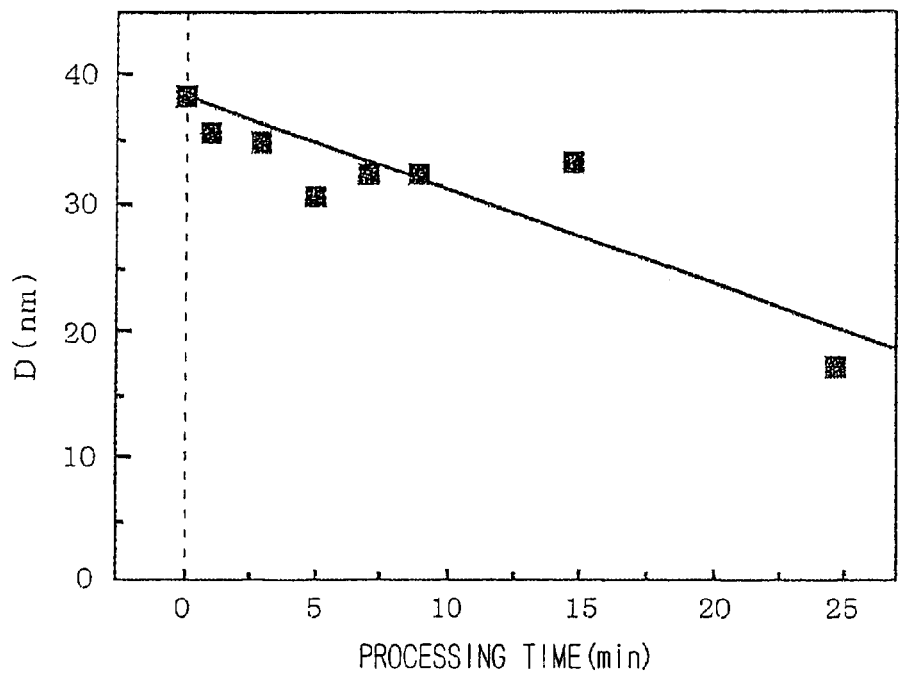
FIGS. 9A and 9B are graphs showing results of Experiment 1.
Figure 9B:
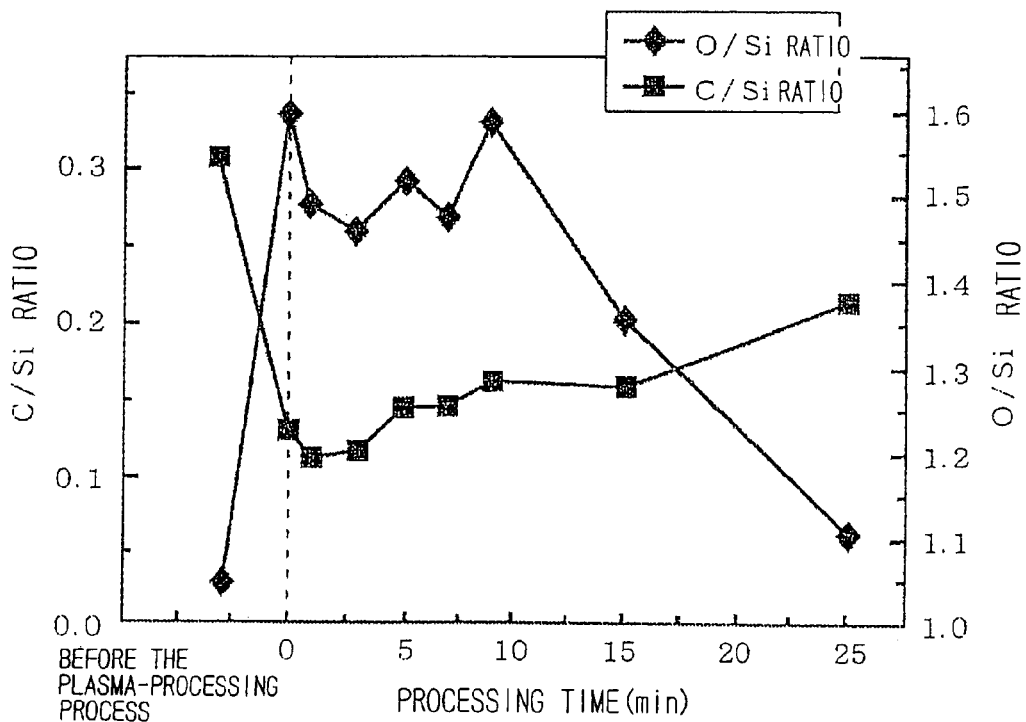

The test wafers W were taken out from the processing vessel 21 into the atmosphere and the following matters of the test wafers W were measured in a predetermined experimental device. The thickness D of the damage layer 60 of each test wafer W shown in FIG. 8A was measured by a spectroscopic ellipsometer. Measured data is shown in FIG. 9A. The surface of the SiOCH film 54 of each test wafer W was analyzed by an XPS (x-ray photoelectron spectroscopy) to determine the respective amounts of elements in the surface. The calculated ratios of the respective amounts of O atoms and C atoms to that of Si atoms, namely, O/Si ratio and C/Si ratio, are shown in FIG. 9B. Similar data on the wafers W before the wafer W were subjected to the plasma-processing process is shown also in FIG. 9B. This experiment intended to measure not only the surface but also the interior of each of the damaged layers 60. Therefore, a measuring apparatus capable of measuring through a depth greater than the thickness of the damaged layer 60 was used. The repair of the damaged layer 60 by $CH_3$ radicals starts from the surface of the SiOCH film 54 and spreads into the SiOCH film 54. Therefore, the measurement of the damaged layer 60 used a measuring apparatus capable measuring the damaged layer 60 through the entire depth thereof in a nondestructive measuring mode. The symbol D in FIG. 8A indicates the thickness of the damage layer 60 formed in the surface of the SiOCH film 54.

As obvious from FIG. 9A, the thickness D of the damaged layer 60 decreases with the processing time of the repairing process. When the test wafer W was processed by the repairing process for 25 min, the thickness of the remaining part of the damaged layer was about 20 nm. It is expected from a linear approximate curve obtained through calculation using the results of the experiments that the thickness D of the damaged layer 60 decreases to zero when the repairing process is continued for about 50 min and the damaged layer 60 is repaired completely in a state before the wafer W is subjected to the plasma-processing process.

As obvious from a curve indicating the variation of the C/Si ratio with time shown in FIG. 9B, the plasma-processing process reduced the C/Si ratio. Thus, as mentioned above, it is conjectured that the damaged layer 60 was formed through the elimination of C atoms from a surface layer of the SiOCH film 54. As obvious from a curve indicating the variation of the O/Si ratio with time shown in FIG. 9B, the O/Si ratio of the SiOCH film 54 increased when the SiOCH film 54 was subjected to the plasma-processing process. Thus it is conjectured that, as mentioned above, OH groups contained in the atmosphere bonded to the dangling bonds of Si atoms.

The respective amounts of C and O atoms approached those before the SiOCH film was subjected to the plasma-processing process, respectively, with the progress of the repairing process. Whereas the O/Si ratio approached the original O/Si ratio closely, the C/Si ratio of the SiOCH film 54 processed by the repairing process was on the order of ⅔ of the original C/Si ratio after the repairing process had been continued for 25 min. It is conjectured that OH groups bonded to the dangling bonds of Si atoms can be eliminated by $CH_3$ radicals and the subsequent bonding to $CH_3$ radicals to the dangling bonds, and such a process of elimination of OH groups and bonding of $CH_3$ radicals to the dangling bonds of Si takes time. It is conjectured from the inclinations of the curves shown in FIGS. 9A and 9D that $CH_3$ radicals repair the surface of the SiOCH film 54 in an initial period of about 15 min of the repairing process and repairs the inner part of the SiOCH film 54 in period subsequent to the initial period. Since the inclinations of the curves are gentle in the initial period of about 15 min and become sharp in the period subsequent to the initial period, it is conjectured that $CH_3$ radicals diffused in the surface of the SiOCH film 54 at an initial stage of the repairing process and then diffused into the interior of the SiOCH film 54.

Experiment 2

Experiment 2 was conducted to examine the intrasurface uniformity of the degree of repair.

Test wafers W were processed by processes specified by the following process conditions.

Example 2

Process conditions for plasma-processing processes and a repairing process were the same as those for Experiment 1, except the process condition shown below.
Repairing process
Processing time: 18 min Comparative Example A wafer in a comparative example was obtained by subjecting a wafer having a surface coated with the SiOCH film 54, and processing the wafer by the same plasma-processing process as Experiment 1. The wafer in the comparative example was not processed by the repairing process.

Results of Experiment

Respective thicknesses D of five parts on the X-axis of a rectangular coordinate system having its origin at the center of the wafer W and five parts on the Y-axis of the same coordinate system were measured by the spectroscopic ellipsometer used in Experiment 1. The supply port through which $CH_3$ radicals were supplied into the processing vessel was directed toward the center of the wafer W. A line connecting the supply port and the center of the wafer W is aligned with the Y-axis, and the X-axis is perpendicular to the Y-axis.

Figure 10A:
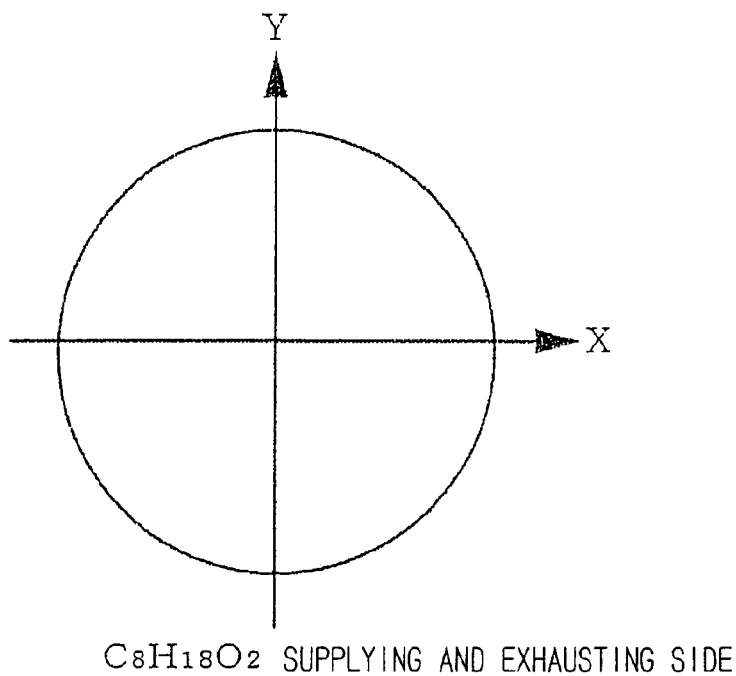
FIGS. 10A and 10B are graphs showing results of Experiment 2.
Figure 10B:
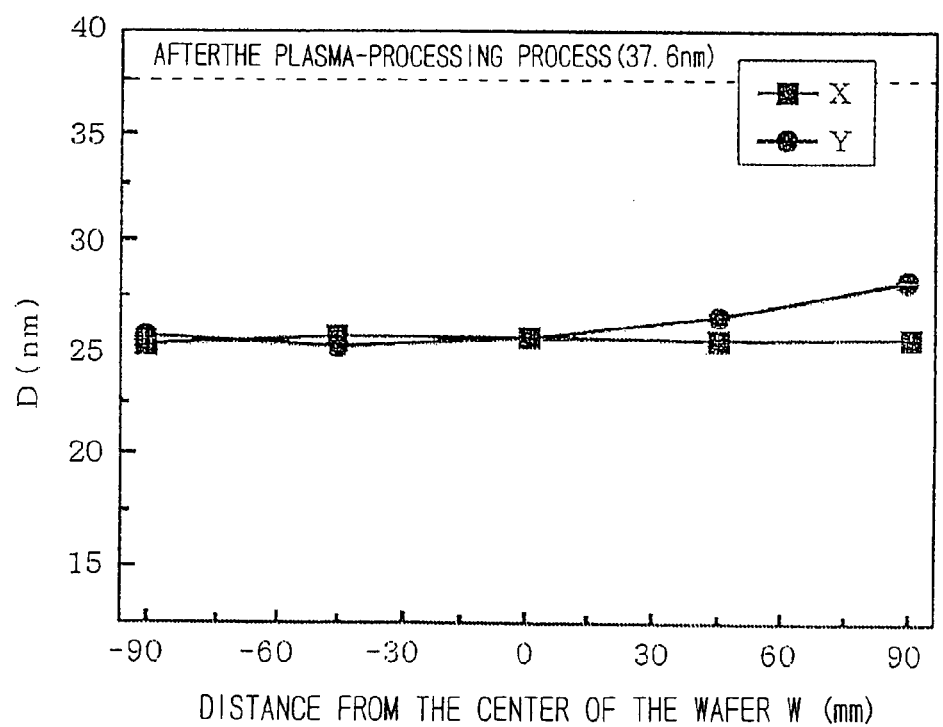

FIG. 10B shows measured data. The respective thicknesses of parts on the X-axis and parts on the Y-axis of the damaged layer 60 on the wafer W in the comparative example were substantially equal and hence data on the comparative example is simplified. As obvious from FIG. 10B, the repairing process could repair the damage layer 60 substantially uniformly over the entire surface of the wafer W and reduced the thickness of the damaged layer 60 to about 25 nm.

The intrasurface degree of repair was somewhat irregular on the Y-axis. However, the differences in the degree of repair among the parts on the Y-axis were as small as 10% or below. Thus it is considered that $CH_3$ radicals were distributed uniformly over the surface of the wafer W. Those facts prove that $CH_3$ radicals bond selectively to the dangling bonds of Si atoms and react scarcely with other compounds, and $CH_3$ radicals remain without reacting for a long time in which $CH_3$ radicals diffuse uniformly in the processing vessel 21.

It is conjectured that the irregularity of the degree of repair on the Y-axis was caused by the position of the gas heating device 63 on the processing vessel. The gas heating device 63 and the exhaust port 22 were on the same side with respect to the wafer W. Thus it is conjectured that the density of $CH_3$ radicals on the side opposite the side of the gas heating device 63 with respect to the wafer W was small and $CH_3$ radicals segregated with respect to a direction parallel to the Y-axis. As mentioned above, it is expected that such an irregularity can be easily improved by changing the respective positions and numbers of the gas heating devices 63 and the exhaust ports 22 and the intrasurface uniformity of the degree of repair can be improved.

Experiment 3

Experiment 3 was conducted to determine the dependence of the degree of repair on the line width of a pattern.

Figure 8B:
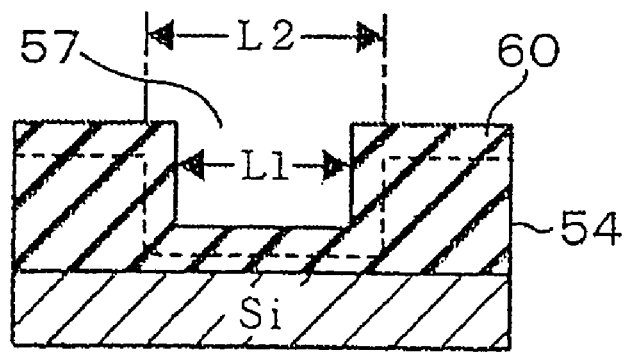

Each of test wafers W was obtained by depositing an organic film forming a resist mask provided with an opening of a width L1 on the SiOCH film formed on the wafer W shown in FIG. 8A. The wafer W was processed by an etching process and an ashing process under the following process conditions to form a recess 57 of a width L1 as shown in FIG. 8B. Then, the wafer W was processed by a repairing process. A wafer in a comparative example was obtained by subjecting a wafer having a surface coated with the SiOCH film 54, and processing the wafer by the etching process and the ashing process. The wafer in the comparative example was not processed by the repairing process. Values of the width L1 were determined respectively for the test wafers W and the wafer W in the comparative example.

Conditions for Etching Process
Frequency of wave (Upper electrode 4): 60 MHz
Power supplied to the upper electrode 4: 1200 W
Frequency of wave (Lower electrode 31): 2 MHz
Power supplied to the lower electrode 31: 1200 W
Process pressure: 10 Pa (75 mtorr)
Process gas: $C_4F_8$(4 sccm)/$N_2$(150 sccm)/Ar(1000 sccm)
Processing time: 90 s
Conditions for Ashing Process
Frequency of wave (Upper electrode 4): 60 MHz
Power supplied to the upper electrode 4: 300 W
Frequency of wave (Lower electrode 31): 2 MHz
Power supplied to the lower electrode 31: 300 W
Process pressure: 1.3 Pa (9.75 mtorr)
Process gas: $O_2$ (300 sccm)
Processing time: 45 s
Conditions for Repairing Process
Process gas: $C_8H_{18}O_2$ gas (300 sccm)
Process pressure: 5.3 Pa (39.75 mtorr)
Temperature of the heating element 65: 1000° C.
Processing time: 10 min Example 3-1

L1: 180 nm

Example 3-2

L1: 200 nm

Example 3-3

L1: 250 nm

Comparative Example 3-1 (Not Repaired)

L1: 180 nm

Comparative Example 3-2 (Not Repaired)

L1: 200 nm

Comparative Example 3-3 (Not Repaired)

Figure 11:
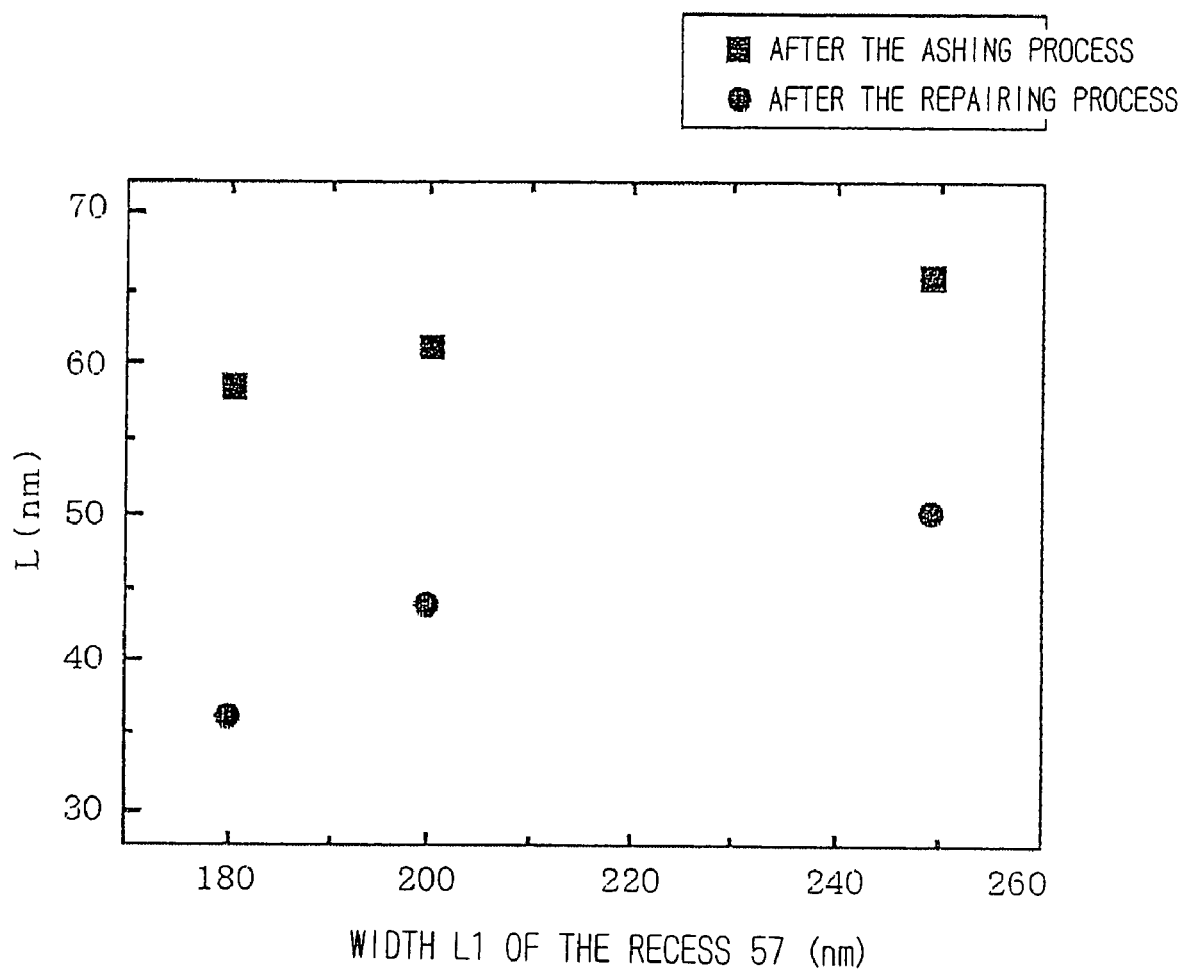
FIG. 11 is a graph showing results of Experiment 3.

L1: 250 nm
Results of Experiments
The test wafers W thus processed were immersed in a 1% by weight HF solution for 30 s. The width L2 of the recess 57 excluding the damaged layer 60 on each test wafer W (FIG. 8B) was measured. A change L=L2−L1 resulting from the dissolution of the damaged layer 60 in the HF solution was calculated. Calculated data is shown in FIG. 11. Whereas the damaged layer 60 formed in the SiOCH film 54 through the elimination of C atoms dissolves in the HF solution, the SiOCH film 54 does not dissolve in the HF solution. Therefore, the thickness of the damaged layer 60 can be known from the change L=L2−L1 resulting from the dissolution of the damaged layer 60 in the HF solution.

The experiment showed that $CH_3$ radicals could act on the side walls of the recess 57 and could repair the damaged layer 60 even if the width of the recess 57 is as narrow as 180 nm. It was found that the change L resulting from the dissolution of the damaged layer 60 in the HF solution was smaller when the width L1 was narrower. Such a result is conjectured to be due to a condition that the side walls of the recess 57 having a smaller width L1 are exposed to the plasmas for a shorter time in the etching and the ashing process.

The smaller the width L1, the greater the change L between the width of the recess 57 after the ashing process and the width of the same after the repairing process. This proves that the thickness of the repaired part of the damaged layer 60 is greater for the damaged layer 60 formed on the side walls of the recess 57 having a narrower width L1. Such a result is conjectured to be due to a condition that the side walls of the recess 57 having a smaller width L1 are exposed to the plasmas for a shorter time in the etching and the ashing process.

Experiment 4

Experiment 4 was conducted to analyze radical species.
The composition of the radicals supplied into the processing vessel 21 was measured by the QMS (quadrupole mass spectrometer). Process conditions for Experiment 4 were the same as those for the repairing process in Experiment 1.

Figure 12:
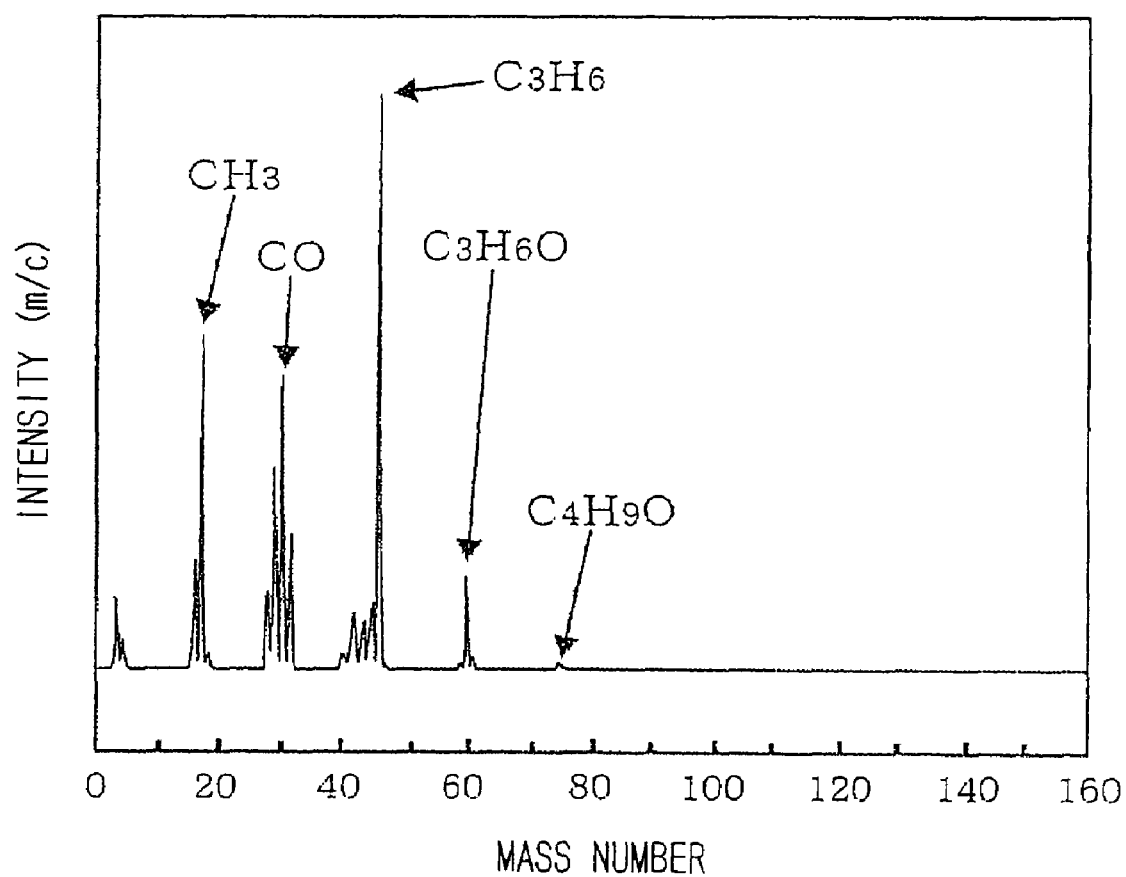
FIG. 12 is a graph showing results of Experiment 4.
Figure 13:
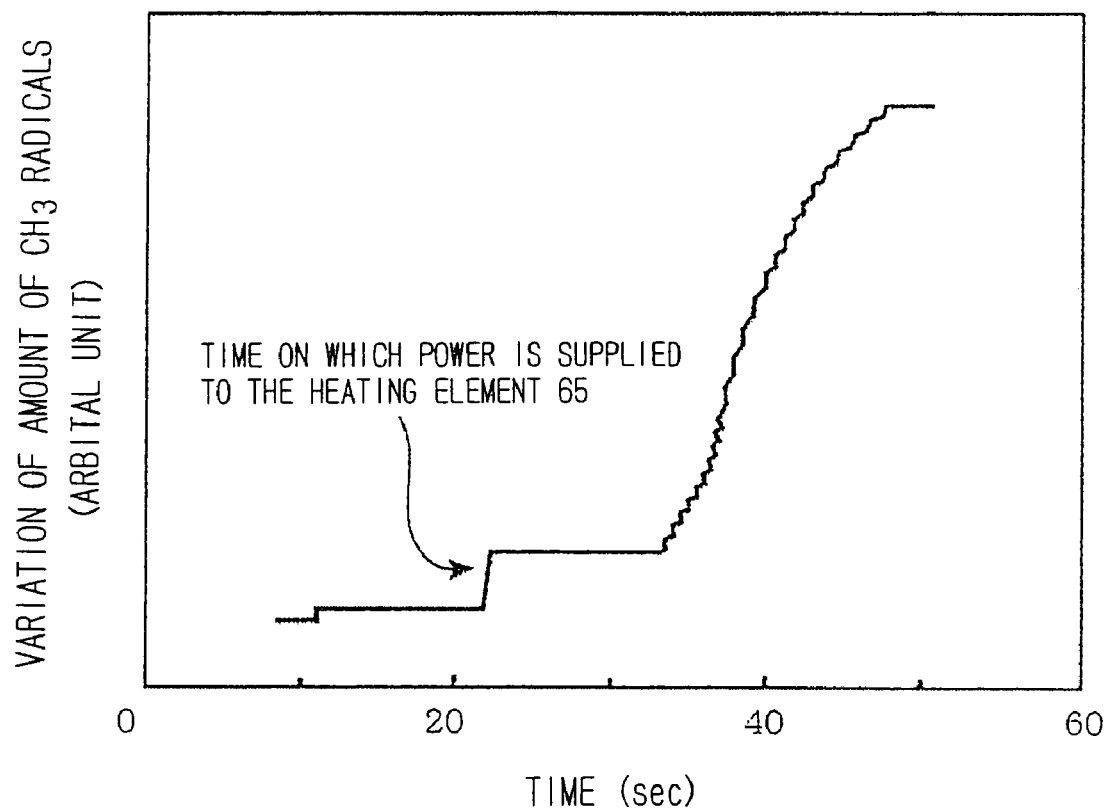
FIG. 13 is a graph showing results of Experiment 5.
Figure 14A:
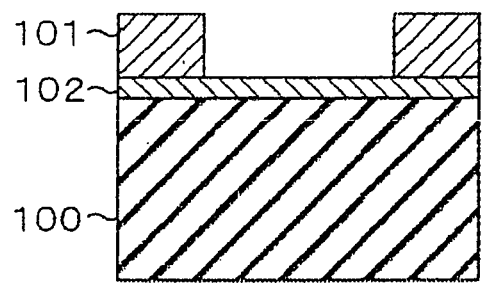
FIGS. 14A and 14B are typical sectional views of a wafer in a known plasma-processing process.
Figure 14B:
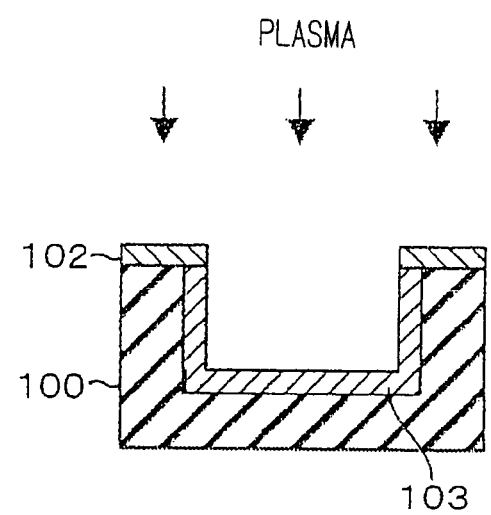

Measured results are sown in FIG. 12.
Results of Experiment
As shown in FIG. 12, $CH_3$, $C_3H_6O$ and $C_4H_9O$ were produced in the processing vessel 21 through the thermal decomposition of the $C_8H_{18}O_2$ gas. Peaks of CO and $C_3H_6$ could not be identified. Therefore, peaks of CO and $C_3H_6$ were estimated on the basis of mass number and compounds that could be possibly produced. As mentioned above, CH, $CH_2$ and C respectively having large attachment coefficients were not produced and $CH_3$ radicals were produced through the thermal decomposition of the $C_8H_{18}O_2$ gas. It is conjectured that compounds other than $CH_3$ radicals did not act on the wafer W and were discharged through the exhaust port 22.

Experiment 5

Experiment 5 was conducted to examine the variation of the amount of $CH_3$ with time.

The amount of CH$_3$ radicals supplied into the processing vessel 21 was measured by a QMS (quadrupole mass spectrometer) similar to that used in Experiment 4. Experiment 5 examined the dependence of the variation of the amount of CH$_3$ radicals on time for which power was supplied to the heating element 65. In the repairing process mentioned in the description of Experiment 1, The supply of C$_8$H$_{18}$O$_2$ gas into the processing vessel 21 was started before supplying power to the heating element 65. The supply of power to the heating element 65 was started after a delay of several seconds from the start of supplying C$_8$H$_{18}$O$_2$ gas. Measured data is shown in FIG. 12.

Results of Experiment

The amount of CH$_3$ radicals increased slightly immediately after starting supplying power to the heating element 65 and then started sharply increasing with time. It was considered that the rate of increase of the amount of CH$_3$ radicals was proportional to the temperature of the heating element 65. The temperature of the heating element 65 stabilized in about 30 s after starting supplying power to the heating element 65. It was assured that CH$_3$ radicals were produced through the thermal decomposition of C$_8$H$_{18}$O$_2$ gas.

What is claimed is:

1. A damaged layer repairing method of repairing a damaged layer in a low-dielectric-constant film, said damaged layer repairing method comprising:
    a CH$_3$ radical producing process for producing CH$_3$ radicals by supplying energy to a CH$_3$ radical source gas; and
    a repairing process for repairing a damaged layer, from which carbon atoms have been eliminated, formed in a low-dielectric-constant film containing silicon, carbon, oxygen and hydrogen by supplying the CH$_3$ radicals in the low-dielectric-constant film and bonding the CH$_3$ radicals to the damaged layer.

2. The damaged layer repairing method of repairing a damaged layer in a low-dielectric-constant film according to claim 1, wherein the CH$_3$ radical producing process produces CH$_3$ radicals through the thermal decomposition of the CH$_3$ radical source gas.

3. The damaged layer repairing method of repairing a damaged layer in a low-dielectric-constant film according to claim 2, wherein the damaged layer is formed by a damaged layer formable process in which the low-dielectric-constant film is exposed to a plasma.

4. The damaged layer repairing method of repairing a damaged layer in a low-dielectric-constant film according to claim 3, wherein the damaged layer formable process in which the low-dielectric-constant film is exposed to a plasma is an etching process for forming a recess in the low-dielectric-constant film and/or an ashing process for ashing an organic resist film formed on the low-dielectric-constant film.

5. The damaged layer repairing method of repairing a damaged layer in a low-dielectric-constant film according to claim 2, wherein a workpiece on which the low-dielectric-constant film is formed is held in a vacuum atmosphere throughout a damaged layer formable process in which a damaged layer is formed in the low-dielectric-constant film and the repairing process.

6. The damaged layer repairing method of repairing a damaged layer in a low-dielectric-constant film according to claim 2, wherein the damaged layer formable process and the repairing process are carried out in a single processing vessel.

7. The damaged layer repairing method of repairing a damaged layer in a low-dielectric-constant film according to claim 2, wherein the CH$_3$ radical source gas is any one of gases of di-t-alkyl peroxide ((CH$_3$)$_3$COOC(CH$_3$)$_3$), methane (CH$_4$), azomethane ((CH$_3$)$_2$N$_2$ and (CH$_3$)$_3$N), 2,2'-azobis isobutylnitrile ((CH$_3$)$_2$C(CN)N=N(CN)C(CH$_3$)$_2$), dimethylamine ((CH$_3$)$_2$NH) and neopentane (C(CH$_3$)$_4$).

8. The damaged layer repairing method of repairing a damaged layer in a low-dielectric-constant film according to claim 1, wherein the damaged layer is formed by a damaged layer formable process in which the low-dielectric-constant film is exposed to a plasma.

9. The damaged layer repairing method of repairing a damaged layer in a low-dielectric-constant film according to claim 8, wherein the damaged layer formable process in which the low-dielectric-constant film is exposed to a plasma is an etching process for forming a recess in the low-dielectric-constant film and/or an ashing process for ashing an organic resist film formed on the low-dielectric-constant film.

10. The damaged layer repairing method of repairing a damaged layer in a low-dielectric-constant film according to claim 1, wherein a workpiece on which the low-dielectric-constant film is formed is held in a vacuum atmosphere throughout a damaged layer formable process in which a damaged layer is formed in the low-dielectric-constant film and the repairing process.

11. The damaged layer repairing method of repairing a damaged layer in a low-dielectric-constant film according to claim 1, wherein the damaged layer formable process and the repairing process are carried out in a single processing vessel.

12. The damaged layer repairing method of repairing a damaged layer in a low-dielectric-constant film according to claim 1, wherein the CH$_3$ radical source gas is any one of gases of di-t-alkyl peroxide ((CH$_3$)$_3$COOC(CH$_3$)$_3$), methane (CH$_4$), azomethane ((CH$_3$)$_2$N$_2$ and (CH$_3$)$_3$N), 2,2'-azobis isobutylnitrile ((CH$_3$)$_2$C(CN)N=N(CN)C(CH$_3$)$_2$), dimethylamine ((CH$_3$)$_2$NH) and neopentane (C(CH$_3$)$_4$).

13. A storage medium storing a computer program for controlling a repairing system for repairing a damaged layer, formed in a low-dielectric-constant film containing silicon, carbon, oxygen and hydrogen, through elimination of carbon atoms from a surface layer of the low-dielectric-constant film;
    wherein the computer program includes instructions to be executed to accomplish the steps of the damaged layer repairing method of repairing a damaged layer in a low-dielectric-constant film according to claim 1.

* * * * *